United States Patent
Yilmaz et al.

(10) Patent No.: US 12,203,165 B2
(45) Date of Patent: Jan. 21, 2025

(54) PROCESS FOR PREPARING ELECTROACTIVE MATERIALS FOR METAL-ION BATTERIES

(71) Applicant: Nexeon Limited, Abingdon (GB)

(72) Inventors: Sefa Yilmaz, Abingdon (GB); Charles A. Mason, Abingdon (GB); Richard Gregory Taylor, Abingdon (GB); David Bent, Abingdon (GB)

(73) Assignee: Nexeon Limited, Abingdon (GB)

( * ) Notice: Subject to any disclaimer, the term of this patent is extended or adjusted under 35 U.S.C. 154(b) by 0 days.

(21) Appl. No.: 18/444,891

(22) Filed: Feb. 19, 2024

(65) Prior Publication Data

US 2024/0384398 A1    Nov. 21, 2024

Related U.S. Application Data

(63) Continuation of application No. 17/416,671, filed as application No. PCT/GB2019/053676 on Dec. 20, 2019, now Pat. No. 11,905,593, which is a continuation of application No. 16/275,246, filed on Feb. 13, 2019, now Pat. No. 10,508,335.

(30) Foreign Application Priority Data

Dec. 21, 2018 (GB) ...................... 1821011

(51) Int. Cl.
*H01M 4/38* (2006.01)
*C23C 16/04* (2006.01)
*C23C 16/24* (2006.01)
*H01M 4/134* (2010.01)
*H01M 4/36* (2006.01)
*H01M 10/05* (2010.01)
*H01M 4/02* (2006.01)

(52) U.S. Cl.
CPC ............ *C23C 16/045* (2013.01); *C23C 16/24* (2013.01); *H01M 4/366* (2013.01); *H01M 4/386* (2013.01); *H01M 10/05* (2013.01); *H01M 2004/021* (2013.01)

(58) Field of Classification Search
None
See application file for complete search history.

(56) References Cited

U.S. PATENT DOCUMENTS 8,673,502 B2 *   3/2014   Petrat .................... H01M 4/587
429/231.95

* cited by examiner

*Primary Examiner* — Alexander M Weddle
(74) *Attorney, Agent, or Firm* — McDonnell Boehnen Hulbert & Berghoff LLP

(57) ABSTRACT

The disclosure relates to a process for preparing particulate materials having high electrochemical capacities that are suitable for use as anode active materials in rechargeable metal-ion batteries. In one aspect, the disclosure provides a process for preparing a particulate material comprising a plurality of composite particles. The process includes providing particulate porous carbon frameworks comprising micropores and/or mesopores, wherein the porous carbon frameworks have a $D_{50}$ particle diameter of at least 20 μm; depositing an electroactive material selected from silicon and alloys thereof into the micropores and/or mesopores of the porous carbon frameworks using a chemical vapour infiltration process in a fluidised bed reactor, to provide intermediate particles; and comminuting the intermediate particles to provide said composite particles.

35 Claims, No Drawings

PROCESS FOR PREPARING ELECTROACTIVE MATERIALS FOR METAL-ION BATTERIES

CROSS-REFERENCE TO RELATED APPLICATIONS

This application is a continuation of U.S. patent application Ser. No. 17/416,671, filed Jun. 21, 2021, which is a U.S. National Stage Entry of International Patent Application no. PCT/GB2019/053676, filed Dec. 20, 2019, which is a continuation of U.S. patent application Ser. No. 16/275,246, filed Feb. 13, 2019, which claims the benefit of priority of United Kingdom Patent Application no. 1821011.2, filed Dec. 21, 2018, each of which is hereby incorporated herein by reference in its entirety.

FIELD

This invention relates in general to electroactive materials that are suitable for use in electrodes for rechargeable metal-ion batteries, and more specifically to a process for preparing particulate materials having high electrochemical capacities that are suitable for use as anode active materials in rechargeable metal-ion batteries.

TECHNICAL BACKGROUND

Rechargeable metal-ion batteries are widely used in portable electronic devices such as mobile telephones and laptops and are finding increasing application in electric or hybrid vehicles. Rechargeable metal-ion batteries generally comprise an anode layer, a cathode layer, an electrolyte to transport metal ions between the anode and cathode layers, and an electrically insulating porous separator disposed between the anode and the cathode. The cathode typically comprises a metal current collector provided with a layer of metal ion containing metal oxide based composite, and the anode typically comprises a metal current collector provided with a layer of an electroactive material, defined herein as a material which is capable of inserting and releasing metal ions during the charging and discharging of a battery. For the avoidance of doubt, the terms "cathode" and "anode" are used herein in the sense that the battery is placed across a load, such that the cathode is the positive electrode and the anode is the negative electrode. When a metal-ion battery is charged, metal ions are transported from the metal-ion-containing cathode layer via the electrolyte to the anode and are inserted into the anode material. The term "battery" is used herein to refer both to a device containing a single anode and a single cathode and to devices containing a plurality of anodes and/or a plurality of cathodes.

There is interest in improving the gravimetric and/or volumetric capacities of rechargeable metal-ion batteries. The use of lithium-ion batteries has already provided a substantial improvement when compared to other battery technologies, but there remains scope for further development. To date, commercial lithium-ion batteries have largely been limited to the use of graphite as an anode active material. When a graphite anode is charged, lithium intercalates between the graphite layers to form a material with the empirical formula $Li_xC_6$ (wherein x is greater than 0 and less than or equal to 1). Consequently, graphite has a maximum theoretical capacity of 372 mAh/g in a lithium-ion battery, with a practical capacity that is somewhat lower (ca. 340 to 360 mAh/g). Other materials, such as silicon, tin and germanium, are capable of intercalating lithium with a significantly higher capacity than graphite but have yet to find widespread commercial use due to difficulties in maintaining sufficient capacity over numerous charge/discharge cycles.

Silicon in particular has been identified as a promising alternative to graphite for the manufacture of rechargeable metal-ion batteries having high gravimetric and volumetric capacities because of its very high capacity for lithium (see, for example, Insertion Electrode Materials for Rechargeable Lithium Batteries, Winter, M. et al. in Adv. Mater. 1998, 10, No. 10). At room temperature, silicon has a theoretical maximum specific capacity in a lithium-ion battery of about 3,600 mAh/g (based on $Li_{15}Si_4$). However, the use of silicon as an anode material is complicated by large volumetric changes on charging and discharging.

Intercalation of lithium into bulk silicon leads to a large increase in the volume of the silicon material, up to 400% of its original volume when silicon is lithiated to its maximum capacity, and repeated charge-discharge cycles cause significant mechanical stress in the silicon material, resulting in fracturing and delamination of the silicon anode material. Volume contraction of silicon particles upon delithiation can result in a loss of electrical contact between the anode material and the current collector. A further difficulty is that the solid electrolyte interphase (SEI) layer that forms on the silicon surface does not have sufficient mechanical tolerance to accommodate the expansion and contraction of the silicon. As a result, newly exposed silicon surfaces lead to further electrolyte decomposition and increased thickness of the SEI layer and irreversible consumption of lithium. These failure mechanisms collectively result in an unacceptable loss of electrochemical capacity over successive charging and discharging cycles.

A number of approaches have been proposed to overcome the problems associated with the volume change observed when charging silicon-containing anodes. The most widespread approach to address the irreversible capacity loss of silicon-containing anodes is to use some form of finely structured silicon as the electroactive material. It has been reported that fine silicon structures below around 150 nm in cross-section, such as silicon films and silicon nanoparticles are more tolerant of volume changes on charging and discharging when compared to silicon particles in the micron size range. However, neither of these is particularly suitable for commercial scale applications in their unmodified form; nanoscale particles are difficult to prepare and handle and silicon films do not provide sufficient bulk capacity. For example, nanoscale particles tend to form agglomerates, making it difficult to obtain a useful dispersion of the particles within an anode material matrix. In addition, the formation of agglomerates of nanoscale particles results in an unacceptable capacity loss on repeated charge-discharge cycling.

It is also known in general terms that electroactive materials such as silicon may be deposited within the pores of a porous carrier material, such as an activated carbon material. These composite materials provide some of the beneficial charge-discharge properties of nanoscale silicon particles while avoiding the handling difficulties of nanoparticles. For instance, Guo et al. (Journal of Materials Chemistry A, 2013, pp. 14075-14079) discloses a silicon-carbon composite material in which a porous carbon substrate provides an electrically conductive framework with silicon nanoparticles deposited within the pore structure of the substrate with uniform distribution. SEI formation over the initial charging cycles is confined to the remaining pore volume such that the remaining silicon is not exposed to the electrolyte in subsequent charging cycles. It is shown that the composite material has improved capacity retention over multiple charging cycles, however the initial capacity of the composite material in mAh/g is significantly lower than for silicon nanoparticles.

JP2003100284 discloses an active material comprising a carbon-based scaffold with small pores branching off from a few larger pores. An electroactive material (e.g. silicon) is indiscriminately located on the walls of both large and small pores and on the external surface of the carbon-based scaffold.

It has been observed that the performance of composite materials comprising a porous carbon framework and an electroactive material such as silicon located within the porous carbon framework can be optimised by using porous carbon frameworks with specific pore structures and a controlled ratio of the electroactive material to the available pore volume. It is believed that a low particle size (e.g. $D_{50}$ below 20 μm) is beneficial for the desired end-use of these composite materials in a metal-ion battery. However, it is difficult to prepare these composite materials in an efficient and consistent manner, in particular on a large scale for commercial uses. It is difficult to control the deposition of the electroactive material such that it is deposited in the desired location within the pores of the porous carbon framework. It is also difficult to control the deposition when preparing a product with the desired low particle size. The present invention is directed towards solving this problem.

Chemical vapour infiltration CVI) is a process of infiltrating a porous substrate material with an additional phase using a reactive gaseous precursor. The porous substrates are placed on to a perforated metallic plate and the mixture of carrier gases and gaseous precursor is passed through the porous substrate which is held at high temperature. The gaseous precursor undergoes a chemical reaction at high temperature within the pore structure of the substrate material and is deposited on the internal surface of the pore space. The CVI process increases the density of the porous substrate material. CVI is of particular utility since there is very little damage to the geometry of the porous substrate. In addition, a high degree of uniformity in the substrate can be achieved by controlling the purity of the reactive gaseous precursor and the pressure and temperature of infiltration.

It has been identified that chemical vapour infiltration (CVI) can be used to deposit an electroactive material into microporous and/or mesoporous carbon materials with particle size less than 20 μm, to yield a composite material with desirable electrochemical properties. In the present invention, CVI particularly refers to processes in which a gaseous precursor of an electroactive material such as silicon is thermally decomposed on a surface to deposit the elemental form of the electroactive material at the surface, and forming gaseous by-products, which allows for deposition onto internal surfaces, in particular surfaces of pore walls.

Typically, the low diffusivity of gaseous silicon precursors used in CVI of silicon compounds into micro and/or mesopore systems, or other gaseous precursors for other electroactive materials, means that it is necessary to use a kinetically limited (surface reaction limited) deposition regime. However, this adds a number of complications from a processing point of view. A main issue is that in large volume samples and reactor systems for high through-put/ large batch and continuous processing, it is difficult to ensure the high thermal homogeneity and mass transfer homogeneity required to preserve a homogeneous deposition rate with respect to reactor location, process time and particle pore system location. Accordingly, it is difficult to use CVI to deposit an electroactive material into pores of a porous carbon framework on a commercially useful scale. There are not believed to be any widespread commercial manufacturing routes which specifically process powders in the size range less than 20 μm using CVI as a deposition technique.

Fluidised bed reactors (FBRs) can be used to perform CVI. FBRs have found wide range of applications in the industry. They provide very efficient means of gas-solid contact while providing a uniform temperature distribution in the bed. This is mainly achieved by using a gas flow to fluidise particles and by allowing all surfaces to contact with the reactant gas. FBRs satisfy many of the mass and heat transfer issues discussed above. When fluidisation is achieved superior solid-solid and gas-solid mixing is observed, in particular when compared to alternative powder processing solutions for performing CVI such as fixed beds and rotary furnaces.

Particles with respect to their size and density can be grouped together for their fluidisation behaviour. These groups are known as Geldart group A, B, C, and D materials. Group A, B and D materials can be fluidized with/without bubbles and slugging behaviours. However, the Geldart C includes low size, low density materials and they can be difficult to fluidize because of the cohesive forces present as a result of small size. Low particle size carbon powders may be considered as Geldart group C materials.

Using FBR-Chemical Vapour Deposition (CVD), including CVI has been used for deposition of various catalytic metals and non-metals on porous and non-porous materials as described in Vahlas et al., Principles and applications of CVD powder technology, Materials Science and Engineering R 53 (2006) 1-72.

However, carbon powders which have a size less than 20 μm tend to form large agglomerates when used in FBRs due to the strength of inter-particle cohesive forces at this length-scale.

This a problem because the fluidisation may only occur as large millimeter-sized sized agglomerates rather than fluidisation of the individual particles, which leads to associated problems relating to the intra-agglomerate mass transfer rate. In addition, there may be no fluidisation of the carbon powders but, instead, channeling ("rat-holing") arising from the applied local applied shear forces of the gas flow being insufficient to break the cohesive forces between particles (i.e. gas finds a way around the powder bed, rather than through). For these reasons, FBRs have not been thought suitable for use in processes involving carbon powders which have a size less than 20 μm.

SUMMARY OF THE INVENTION

The present invention uses chemical vapour infiltration into a porous carbon powder in a fluidised state, allowing control of the kinetic and thermodynamic conditions of the infiltration reaction and ensuring each porous carbon particle sees a similar chemical and thermal environment. In essence, the present invention treats individual micron scale powders as mini infiltration substrates, reducing the characteristic length-scale for precursor diffusion and reaction and facilitating a transition to a continuous processing for mass production.

In a first aspect, the invention provides a process for preparing a particulate material comprising a plurality of composite particles, the process comprising:

(a) providing particulate porous carbon frameworks comprising micropores and/or mesopores, wherein the porous carbon frameworks have a $D_{50}$ particle diameter of at least 20 μm;

(b) depositing an electroactive material selected from silicon, tin, aluminium, germanium and alloys thereof into the micropores and/or mesopores of the porous carbon frameworks using a chemical vapour infiltration process in a fluidised bed reactor, to provide intermediate particles; and (c) comminuting the intermediate particles to provide said composite particles.

Accordingly, the process of the invention utilises the advantages of CVI for depositing an electroactive material into pores of a porous carbon framework, thus providing a functional nanostructure comprising the electroactive material. The process also utilises the advantages of using a FBR to perform CVI. The process also avoids the difficulties of using a FBR with carbon powders of a low particle size since the process uses particulate porous carbon frameworks with a $D_{50}$ particle diameter of at least 20 μm as a starting material. The comminuting step means that the process may be used to provide composite particles a reduced particle size compared to the starting material, which is believed to be useful in the desired end-use in metal-ion batteries. In particular, composite particles within these size ranges are ideally suited for use in composite film negative electrodes (or "anodes") for metal-ion batteries due to their dispersibility in slurries, their structural robustness and their capacity retention over repeated charge-discharge cycles. Such composite films are typically less than 100 μm thick, or less than 50 μm thick and the smaller particle size also helps to achieve denser films of uniform thickness. The process of the invention thus provides an effective process for preparing composite particles which is suitable for large-scale commercial use.

It may appear counterintuitive to prepare intermediate composite particles using CVI in a FBR and then to comminute the intermediate particles. In particular, the comminution step may have been expected to damage the functional nanostructure of intermediate particles obtained from the CVI process, namely, the electroactive material deposited within the pores of the carbon framework. However, the inventors have found that comminution may occur without a significant level of damage due to the relative μm-length scale of fracture compared to the nm-length scale of the functional unit of the composite particles. Since the carbon frameworks comprise micropores and/or mesopores, when comminuted the desired properties are retained in the product.

The process of the invention enables the properties of the porous carbon framework starting material to be chosen in order to provide a final product with a desired set of properties. For instance, choosing the porous carbon framework to have a specific pore structure allows the production of a product with a specific micropore and/or mesopore structure since the comminution step may occur without significant damage to the pore structure.

The electroactive material may be silicon or tin. Preferably the electroactive material is silicon. The electroactive material may optionally comprise a minor amount of one or more dopants. Suitable dopants include boron and phosphorus, other n-type or p-type dopants, or nitrogen. When silicon is the electroactive material, the silicon may also be doped with a minor amount of one or more other electroactive materials such as tin, aluminium, and germanium. Preferably, the dopants are present in a total amount of no more than 2 wt % based on the total amount of the electroactive material and the dopant(s).

For the avoidance of doubt, the term "particle diameter" as used herein refers to the equivalent spherical diameter (esd), i.e. the diameter of a sphere having the same volume as a given particle, wherein the particle volume is understood to include the volume of any intra-particle pores. The terms "$D_{50}$" and "$D_{50}$ particle diameter" as used herein refer to the volume-based median particle diameter, i.e. the diameter below which 50% by volume of the particle population is found. The terms "$D_{10}$" and "$D_{10}$ particle diameter" as used herein refer to the 10th percentile volume-based median particle diameter, i.e. the diameter below which 10% by volume of the particle population is found. The terms "$D_{90}$" and "$D_{90}$ particle diameter" as used herein refer to the 90th percentile volume-based median particle diameter, i.e. the diameter below which 90% by volume of the particle population is found.

The terminology "$D_n$" used herein to define particle diameter distributions should be distinguished from the terminology "$PD_n$" which is used herein to define pore diameter distributions. As used herein, the general term "$PD_n$ pore diameter" refers to the volume-based nth percentile pore diameter, based on the total volume of micropores and mesopores. For instance, the term "$D_{50}$ pore diameter" as used herein refers to the pore diameter below which 50% of the total micropore and mesopore volume, represented by $P_1$, is found).

For the avoidance of doubt, any macropore volume (pore diameter greater than 50 nm) is not taken into account for the purpose of determining $PD_n$ values.

Particle diameters and particle size distributions can be determined by routine laser diffraction techniques in accordance with ISO 13320:2009. Laser diffraction relies on the principle that a particle will scatter light at an angle that varies depending on the size the particle and a collection of particles will produce a pattern of scattered light defined by intensity and angle that can be correlated to a particle size distribution. A number of laser diffraction instruments are commercially available for the rapid and reliable determination of particle size distributions. Unless stated otherwise, particle size distribution measurements as specified or reported herein are as measured by the conventional Malvern Mastersizer™ 3000 particle size analyzer from Malvern Instruments. The Malvern Mastersizer™ 3000 particle size analyzer operates by projecting a helium-neon gas laser beam through a transparent cell containing the particles of interest suspended in an aqueous solution. Light rays which strike the particles are scattered through angles which are inversely proportional to the particle size and a photodetector array measures the intensity of light at several predetermined angles and the measured intensities at different angles are processed by a computer using standard theoretical principles to determine the particle size distribution. Laser diffraction values as reported herein are obtained using a wet dispersion of the particles in distilled water. The particle refractive index is taken to be 3.50 and the dispersant index is taken to be 1.330. Particle size distributions are calculated using the Mie scattering model.

Porous Carbon Frameworks

The porous carbon frameworks have a $D_{50}$ particle diameter of at least 20 μm. In this way the porous carbon frameworks can be readily used in a FBR. Optionally, the porous carbon frameworks have a $D_{50}$ particle diameter in the range 20 to 1000 μm, or of 30 to 500 μm, or of 60 to 150 μm. Optionally, the porous carbon frameworks have $D_{50}$ particle diameter of at least 30 μm, at least 40 μm, or at least 50 µm, or at least 60 µm, or at least 70 µm, or at least 80 µm. Optionally, the porous carbon frameworks have a $D_{50}$ particle diameter of no more than 1000 µm, or no more than 500 µm, or no more than 250 µm, or no more than 150 µm.

Optionally, the porous carbon frameworks have a $D_{10}$ particle diameter of at least 5 µm, at least 15 µm, at least 40 µm, or at least 50 µm, or at least 60 µm, or at least 70 µm. By maintaining the $D_{10}$ particle diameters above these values the presence of a large number of carbon frameworks with a small particle size which may be unsuitable for FBR is advantageously avoided.

Optionally, the porous carbon frameworks have a $D_{90}$ particle diameter of no more than 1,500 µm, or no more than 1,000 µm, or no more than 750 µm, or no more than 500 µm, or no more than 200 µm. Optionally, the porous carbon frameworks have a $D_{98}$ particle diameter of no more than 1,550 µm, or no more than 1,050 µm, or no more than 800 µm, or no more than 550 µm, or no more than 250 µm. By maintaining the $D_{90}$ and/or $D_{98}$ particle diameters below these values the presence of a large number of carbon frameworks with a large particle size which may be unsuitable for CVI is advantageously avoided.

For instance, the porous carbon frameworks may have a $D_{10}$ particle diameter of at least 15 µm, a $D_{50}$ particle diameter of at least 20 µm, and a $D_{90}$ particle diameter of no more than 200 µm. The porous carbon frameworks may have a $D_{10}$ particle diameter of at least 5 µm, a $D_{50}$ particle diameter in the range from 20 to 250 µm, a $D_{90}$ particle diameter of no more than 750 µm, and a $D_{98}$ particle size of no more than 1,000 µm. The porous carbon frameworks may have a $D_{10}$ particle diameter of at least 5 µm, a $D_{50}$ particle diameter in the range from 20 to 200 µm, a $D_{90}$ particle diameter of no more than 500 µm, and a $D_{98}$ particle size of no more than 800 µm. The porous carbon frameworks may have a $D_{10}$ particle diameter of at least 40 µm, a $D_{50}$ particle diameter in the range from 60 to 150 µm, and a $D_{90}$ particle diameter of no more than 200 µm, and a $D_{98}$ particle size of no more than 250 µm.

The porous carbon frameworks preferably have a narrow size distribution span. For instance, the particle size distribution span (defined as $(D_{90}-D_{10})/D_{50}$) is preferably 5 or less, more preferably 4 or less, more preferably 3 or less, more preferably 2 or less, and most preferably 1.5 or less. By maintaining a narrow size distribution span, a consistent deposition of the electroactive material into the pores of the carbon frameworks is more readily achievable.

The porous carbon framework suitably comprises a three-dimensionally interconnected open pore network comprising a combination of micropores and/or mesopores and optionally a minor volume of macropores. In accordance with IUPAC terminology, the term "micropore" is used herein to refer to pores of less than 2 nm in diameter, the term "mesopore" is used herein to refer to pores of 2 to 50 nm in diameter, and the term "macropore" is used to refer to pores of greater than 50 nm diameter.

References herein to the volume of micropores, mesopores and macropores in the porous carbon framework, and any references to the distribution of pore volume within the porous carbon framework, refer to the internal pore volume of the porous carbon framework taken in isolation (i.e. in the absence of any electroactive material or other materials occupying some or all of the pore volume).

The volume fraction of micropores (based on the total volume of micropores and mesopores) is represented herein by the symbol $\varphi_a$ and the volume fraction of mesopores (based on the total volume of micropores and mesopores) is represented by the symbol $\varphi_b$, and therefore it will be understood that $\varphi_a+\varphi_b=1$.

The porous carbon framework is characterised by a pore volume in the form of micropores and/or mesopores. The total volume of micropores and mesopores (i.e. the total pore volume in the range from 0 to 50 nm) may be referred to herein as $P_1$ cm³/g, wherein $P_1$ represents a dimensionless natural number. The value of $P_1$ is also used to correlate the available pore volume in the porous carbon framework to the weight ratio of electroactive material to the porous carbon framework in the final product.

For the avoidance of doubt, $P_1$ as used herein relates to the pore volume of the porous carbon framework when measured in isolation, i.e. in the absence of silicon or any other material occupying the pores of the porous carbon framework. Similarly, the references herein to the volume of micropores, mesopores and macropores in the porous carbon framework, and any references to the distribution of pore volume within the porous carbon framework, refer to the internal pore volume of the porous carbon framework in isolation (i.e. in the absence of any silicon or other materials occupying the pore volume).

$P_1$ may have a value in the range of from 0.4 to 2.5. Thus, the porous carbon frameworks may have a pore volume of at least 0.4 cm³/g and up to 2.5 cm³/g.

$P_1$ may have a value in the range from 0.4 to 0.6. This corresponds to a low pore volume in the form of micropores and/or mesopores.

Alternatively, $P_1$ may have a value of at least 0.6, or at least 0.65, or at least 0.7, or at least 0.75, or at least 0.8, or at least 0.85, or at least 0.9, or at least 0.95, or at least 1, or at least 1.05, or at least 1.1, or at least 1.2. The use of a high porosity carbon framework is advantageous since it allows a larger amount of silicon to be accommodated within the pore structure, and it has been found that high porosity carbon frameworks in which the pore volume is predominantly in the form of micropores and smaller mesopores have sufficient strength to accommodate the volumetric expansion of the electroactive material without fracturing or otherwise degrading the porous carbon framework.

$P_1$ may have a value of no more than 2.5, or no more than 2.2, or no more than 2, or no more than 1.8, or no more than 1.6, or no more than 1.5, or no more than 1.4, or no more than 1.3, or no more than 1.2. The internal pore volume of the porous carbon framework is suitably capped at a value at which increasing fragility of the porous carbon framework outweighs the advantage of increased pore volume accommodating a larger amount of the electroactive material.

The value of $P_1$ may be in the range from 0.4 to 2.5, or in the range from 0.6 to 2.5, or in the range from 0.7 to 2, or in the range from 0.7 to 1.2

The volume fraction of micropores ($\varphi_a$) may be at least 0.1, or in the range from 0.1 to 0.9. Preferably, $\varphi_a$ is greater than 0.5, more preferably greater than 0.6, more preferably greater than 0.7, more preferably greater than 0.8.

A fraction of pores having diameters in the larger mesopore range may be advantageous to facilitate electrolyte access to the electroactive material in the final product. Therefore, pores having a diameter in the range from 10 to 50 nm (i.e. larger mesopores) may optionally constitute at least 1%, at least 2%, at least 5% or at least 10% of the total micropore and mesopore volume of the porous carbon framework.

The pore size distribution of the porous carbon framework may be monomodal, bimodal or multimodal. As used herein, the term "pore size distribution" relates to the distribution of pore size relative to the cumulative total internal pore volume of the porous carbon framework. A bimodal or multimodal pore size distribution may be preferred since close proximity between the smallest pores and pores of larger diameter provides the advantage of efficient ionic transport through the porous network to the electroactive material. Accordingly, the composite particles prepared from the porous carbon frameworks have high ionic diffusivity and therefore improved rate performance.

Suitably, a bimodal or multimodal pore size distribution includes a peak pore size in the micropore range and a peak pore size in the mesopore size range which differ from one another by a factor of from 5 to 20, more preferably by a factor of about 10. For instance, the porous carbon framework may have a bimodal pore size distribution including a peak at a pore size of 1.5 nm and a peak at a pore size of 15 nm. The porous carbon framework may have a bimodal pore size distribution including a peak at a pore size of 2 nm and a peak at a pore size of 20 nm. The porous carbon framework may have a bimodal pore size distribution including a peak at a pore size of 1.2 nm and a peak at a pore size of 12 nm.

The total volume of micropores and mesopores and the pore size distribution of micropores and mesopores are determined using nitrogen gas adsorption at 77 K down to a relative pressure $p/p_0$ of $10^{-6}$ using quenched solid density functional theory (QSDFT) in accordance with standard methodology as set out in ISO 15901-2 and ISO 15901-3. Nitrogen gas adsorption is a technique that characterizes the porosity and pore diameter distributions of a material by allowing a gas to condense in the pores of a solid. As pressure increases, the gas condenses first in the pores of smallest diameter and the pressure is increased until a saturation point is reached at which all of the pores are filled with liquid. The nitrogen gas pressure is then reduced incrementally, to allow the liquid to evaporate from the system.

Analysis of the adsorption and desorption isotherms, and the hysteresis between them, allows the pore volume and pore size distribution to be determined. Suitable instruments for the measurement of pore volume and pore size distributions by nitrogen gas adsorption include the TriStar II and TriStar II Plus porosity analyzers, which are available from Micromeritics Instrument Corporation, USA, and the Autosorb IQ porosity analyzers, which are available from Quantachrome Instruments.

Nitrogen gas adsorption is effective for the measurement of pore volume and pore size distributions for pores having a diameter up to 50 nm, but is less reliable for pores of much larger diameter. For the purposes of the present invention, nitrogen adsorption is therefore used to determine pore volumes and pore size distributions only for pores having a diameter up to and including 50 nm. As set out above, the value of $P_1$ is determined by taking into account only pores of diameter up to and including 50 nm (i.e. only micropores and mesopores), and the values of $PD_n$ and $\varphi_a$, $\varphi_b$, $\varphi_{20}$, $\varphi_{10}$, and $\varphi_5$ (discussed below) are likewise determined relative to the total volume of micropores and mesopores only.

In view of the limitations of available analytical techniques it is not possible to measure pore volumes and pore size distributions across the entire range of micropores, mesopores and macropores using a single technique. In the case that the porous carbon framework comprises macropores, the volume of pores in the range of greater than 50 nm and up to 100 nm is identified herein with the value of $P_2$ cm$^3$/g and is measured by mercury porosimetry. The value of $P_2$ relates to the pore volume of the porous carbon framework when measured in isolation, i.e. in the absence of an electroactive material or any other material occupying the pores of the porous carbon framework.

For the avoidance of doubt, the value of $P_2$ takes into account only pores having a diameter of from greater than 50 nm up to and including 100 nm, i.e. it includes only the volume of macropores up to 100 nm in diameter. Any pore volume measured by mercury porosimetry at pore sizes of 50 nm or below is disregarded for the purposes of determining the value of $P_2$. Pore volume measured by mercury porosimetry above 100 nm is assumed for the purposes of the invention to be inter-particle porosity and is also not take into account when determining the value of $P_2$. As set out above, nitrogen adsorption is used to characterize the mesopores and micropores.

Mercury porosimetry is a technique that characterizes the porosity and pore diameter distributions of a material by applying varying levels of pressure to a sample of the material immersed in mercury. The pressure required to intrude mercury into the pores of the sample is inversely proportional to the size of the pores. Values obtained by mercury porosimetry as reported herein are obtained in accordance with ASTM UOP578-11, with the surface tension y taken to be 480 mN/m and the contact angle $\varphi$ taken to be 140° for mercury at room temperature. The density of mercury is taken to be 13.5462 g/cm$^3$ at room temperature. A number of high precision mercury porosimetry instruments are commercially available, such as the AutoPore IV series of automated mercury porosimeters available from Micromeritics Instrument Corporation, USA. For a complete review of mercury porosimetry reference may be made to P. A. Webb and C. Orr in "Analytical Methods in Fine Particle Technology, 1997, Micromeritics Instrument Corporation, ISBN 0-9656783-0.

The volume of macropores (and therefore the value of $P_2$) is preferably small as compared to the volume of micropores and mesopores (and therefore the value of $P_1$). While a small fraction of macropores may be useful to facilitate electrolyte access into the pore network, the advantages of the invention are obtained substantially by accommodating silicon in micropores and smaller mesopores.

Thus, in accordance with the invention the total volume of macropores in the porous carbon framework is $P_2$ cm$^3$/g as measured by mercury porosimetry, wherein $P_2$ preferably has a value of no more than $0.2 \times P_1$, or no more than $0.1 \times P_1$, or no more than $0.05 \times P_1$, or no more than $0.02 \times P_1$, or no more than $0.01 \times P_1$, or no more than $0.005 \times P_1$.

In preferred embodiments, $P_2$ has a value of no more than 0.3, or no more than 0.25, or no more than 0.20, or no more than 0.15, or no more than 0.1, or no more than 0.05. As discussed above in relation to larger mesopores, a small pore volume fraction in the macropore range may be advantageous to facilitate electrolyte access to the electroactive material in the final product.

The open pore network optionally includes a hierarchical pore structure, i.e. a pore structure in which there is a degree of ordering of pore sizes, with smaller pores branching from larger pores.

It will be appreciated that intrusion techniques such as gas adsorption and mercury porosimetry are effective only to determine the pore volume of pores that are accessible to nitrogen or to mercury from the exterior of the porous carbon framework. Porosity values ($P_1$ and $P_2$) as specified herein shall be understood as referring to the volume of open pores, i.e. pores that are accessible to a fluid from the exterior of the porous carbon framework. Fully enclosed pores which cannot be identified by nitrogen adsorption or mercury porosimetry shall not be taken into account herein when specifying porosity values. Likewise, any pore volume located in pores that are so small as to be below the limit of detection by nitrogen adsorption is not taken into account for determining the value of $P_1$.

The porous carbon framework may comprise crystalline carbon or amorphous carbon, or a mixture of amorphous and crystalline carbon. The porous carbon framework may be either a hard carbon or soft carbon framework and may suitably be obtained by known procedures involving the pyrolysis of polymers or organic matter.

As used herein, the term "hard carbon" refers to a disordered carbon matrix in which carbon atoms are found predominantly in the $sp^2$ hybridised state (trigonal bonds) in nanoscale polyaromatic domains. The polyaromatic domains are cross-linked with a chemical bond, e.g. a C—O—C bond. Due to the chemical cross-linking between the polyaromatic domains, hard carbons cannot be converted to graphite at high temperatures. Hard carbons have graphite-like character as evidenced by the large G-band (~1600 $cm^{-1}$) in the Raman spectrum. However, the carbon is not fully graphitic as evidenced by the significant D-band (~1350 $cm^{-1}$) in the Raman spectrum.

As used herein, the term "soft carbon" also refers to a disordered carbon matrix in which carbon atoms are found predominantly in the $sp^2$ hybridised state (trigonal bonds) in polyaromatic domains having dimensions in the range from 5-200 nm. In contrast to hard carbons, the polyaromatic domains in soft carbons are associated by intermolecular forces but are not cross-linked with a chemical bond. This means that they will graphitise at high temperature. The porous carbon framework preferably comprises at least 50% $sp^2$ hybridised carbon as measured by XPS. For example, the porous carbon framework may suitably comprise from 50% to 98% $sp^2$ hybridised carbon, from 55% to 95% $sp^2$ hybridised carbon, from 60% to 90% $sp^2$ hybridised carbon, or from 70% to 85% $sp^2$ hybridised carbon.

A variety of different materials may be used to prepare suitable porous carbon frameworks.

Examples of organic materials that may be used include plant biomass including lignocellulosic materials (such as coconut shells, rice husks, wood etc.) and fossil carbon sources such as coal. Examples of polymeric materials which form porous carbon frameworks on pyrolysis include phenolic resins, novolac resins, pitch, melamines, polyacrylates, polystyrenes, polyvinylalcohol (PVA), polyvinylpyrrolidone (PVP), and various copolymers comprising monomer units of acrylates, styrenes, α-olefins, vinyl pyrrolidone and other ethylenically unsaturated monomers. A variety of different hard carbon materials are available in the art depending on the starting material and the conditions of the pyrolysis process.

The porous carbon framework may undergo a chemical or gaseous activation process to increase the volume of mesopores and micropores. A suitable activation process comprises contacting pyrolysed carbon with one or more of oxygen, steam, CO, $CO_2$ and KOH at a temperature in the range from 600 to 1000° C.

Mesopores can also be obtained by known templating processes, using extractable pore formers such as MgO and other colloidal or polymer templates which can be removed by thermal or chemical means post pyrolysis or activation.

The porous carbon frameworks preferably have a BET surface area of at least 750 $m^2/g$, or at least 1,000 $m^2/g$, or at least 1,250 $m^2/g$, or at least 1,500 $m^2/g$. The term "BET surface area" as used herein should be taken to refer to the surface area per unit mass calculated from a measurement of the physical adsorption of gas molecules on a solid surface, using the Brunauer-Emmett-Teller theory, in accordance with ISO 9277. Preferably, the BET surface area of the conductive porous particle framework is no more than 4,000 $m^2/g$, or no more than 3,500 $m^2/g$, or no more than 3,250 $m^2/g$, or no more than 3,000 $m^2/g$.

As discussed above, the inventors have recognised that since the carbon frameworks comprise micropores and/or mesopores, when comminuted the desired properties are retained in the product. Accordingly, the invention allows for the desired properties of the composite particle product to be targeted by controlling the pore structure of the porous carbon frameworks. Certain classes of porous carbon frameworks are discussed below and can be utilised in the invention to provide certain classes of composite particle product. It will be understood that the features of the classes of porous carbon frameworks discussed below are to be considered in combination with the features of the porous carbon frameworks discussed above, such as the particle size.

Porous Carbon Frameworks 1

Porous carbon frameworks 1 are characterised by a $P_1$ value of at least 0.5 and a $PD_{50}$ pore diameter of no more than 5 nm.

Preferably, the value of $P_1$ is at least 0.75, or at least 0.8, or at least 0.85, or at least 0.9, or at least 0.95, or at least 1, for example at least 1.05, or at least 1.1, or at least 1.15, or at least 1.2.

The value of $P_1$ may be up to 2.5. Preferably, the value of $P_1$ may be no more than 2.2, or no more than 2, or no more than 1.8, or no more than 1.6, or no more than 1.5, or no more than 1.4, or no more than 1.3, or no more than 1.2, or no more than 1.1, or no more than 1.0, or no more than 0.9. More preferably, the value of $P^1$ is no more than 1.2, or no more than 1.1, or no more than 1.0, or no more than 0.9.

Preferably, the value of $P_1$ may be, for instance, in the range from 0.7 to 1.5, or in the range from 0.75 to 1.4, or in the range from 0.7 to 1.3, or in the range from 0.75 to 1.3, or in the range from 0.7 to 1.2, or in the range from 0.75 to 1.2, or in the range from 0.7 to 1, or in the range from 0.75 to 1, or in the range from 0.7 to 0.9, or in the range from 0.75 to 0.9.

The $PD_{50}$ pore diameter of the porous carbon frameworks 1 is preferably no more than 4 nm, or no more than 3 nm, or no more than 2.5 nm, or no more than 2 nm. Preferably, the $PD_{50}$ pore diameter of the porous carbon framework is at least 0.8 nm, or at least 1 nm, or at least 1.2 nm. Thus, it is particularly preferred that 50% or more of the total micropore and mesopore volume be in the form of micropores.

More preferably, at least 80% of the total micropore and mesopore volume of porous carbon framework 1 is in the form of pores having a diameter of no more than 5 nm. Accordingly, the $PD_{80}$ pore diameter of porous carbon framework 1 is preferably no more than 5 nm, or no more than 4 nm, or no more than 3 nm, or no more than 2.5 nm, or no more than 2 nm.

The volume of larger mesopores in porous carbon framework 1 is preferably limited such that the $PD_{90}$ pore diameter is no more than 20 nm, or no more than 15 nm, or no more than 12 nm, or no more than 10 nm, or no more than 8 nm, or no more than 6 nm, or no more than 5 nm, or no more than 4 nm, or no more than 3 nm, or no more than 2.5 nm, or no more than 2 nm.

Preferably, the $PD_{95}$ pore diameter is no more than 20 nm, or no more than 15 nm, or no more than 12 nm, or no more than 10 nm.

Porous Carbon Frameworks 2

Porous carbon frameworks 2 are characterised by a $P_1$ value of at least 0.6 and a volume fraction of micropores $\varphi_a$ in the range from 0.1 to 0.9.

Porous carbon frameworks 2 are also characterised by a pore volume that is substantially skewed towards smaller pores, such that a minimum of 75% of the total micropore and mesopore volume is in the form of pores having a diameter of no more than 20 nm. The volume fraction of pores having a diameter of no more than 20 nm (based on the total volume of micropores and mesopores) is represented herein by the symbol $\varphi_{20}$, with the symbols $\varphi_{10}$ and $\varphi_5$ being used to define the corresponding volume fractions of pores having diameters of no more than 10 nm and no more than 5 nm, respectively.

Preferably, the value of $P_1$ is at least 0.65, or at least 0.7, or at least 0.75, or at least 0.8, or at least 0.85, or at least 0.9, or at least 0.95, or at least 1. Optionally, $P_1$ may be at least 1.05, or at least 1.1, or at least 1.15, or at least 1.2. The value of $P_1$ may be up to 2.2. More preferably, the value of $P^1$ is no more than 2.2, or no more than 1.8, or no more than 1.6, or no more than 1.5, or no more than 1.4, or no more than 1.3, or no more than 1.2.

Preferably, the value of $P_1$ may be, for instance, in the range from 0.6 to 1.4, or in the range from 0.65 to 1.4, or in the range from 0.7 to 1.4, or in the range from 0.75 to 1.4 or in the range from 0.6 to 1.3, or in the range from 0.65 to 1.3, or in the range from 0.7 to 1.3, or in the range from 0.75 to 1.3 or in the range from 0.6 to 1.2, or in the range from 0.65 to 1.2, or in the range from 0.7 to 1.2, or in the range from 0.75 to 1.2, or in the range from 0.6 to 1, or in the range from 0.65 to 1, or in the range from 0.7 to 1, or in the range from 0.75 to 1, or in the range from 0.6 to 0.9, or in the range from 0.65 to 0.9, or in the range from 0.7 to 0.9, or in the range from 0.75 to 0.9.

The value of $\varphi_a$ is preferably in the range from 0.15 to 0.85, more preferably in the range from 0.2 to 0.8. In some embodiments, $\varphi_a$ is preferably in the range from 0.45 to 0.85, or in the range from 0.5 to 0.8, or in the range from 0.6 to 0.8, to take particular advantage of the high capacity retention of very fine nanostructures of electroactive material located within micropores. In other cases, $\varphi_a$ is preferably in the range from 0.2 to 0.5, or in the range from 0.3 to 0.5, to take particular advantage of the opportunity for high loadings of electroactive material.

Preferably, $\varphi_{20}$ is at least 0.8, more preferably at least 0.85, more preferably at least 0.9.

Preferably, $\varphi_{10}$ is at least 0.75, or at least 0.8, or at least 0.85, based on the total volume of micropores and mesopores. Preferably, $\varphi_5$ is at least 0.75, or at least 0.8, or at least 0.85, based on the total volume of micropores and mesopores. Thus, at least 75% of the total micropore and mesopore volume of the porous carbon framework is preferably in the form of pores having a diameter of no more than 10 nm, and more preferably no more than 5 nm.

Porous Carbon Frameworks 3

Porous carbon frameworks 3 are characterised by a $P_1$ value of at least 0.6 and a $PD_{50}$ pore diameter of no more than 2 nm.

Preferably, the value of $P_1$ is at least 0.75, or at least 0.8, or at least 0.85. Optionally $P_1$ may be at least 0.9, or at least 0.95, or at least 1, or at least 1.05, or at least 1.1, or at least 1.15, or at least 1.2. In general, the value of $P_1$ may be no more than 2.5. More preferably, the value of $P^1$ is no more than 2.4, or no more than 2.2, or no more than 2, or no more than 1.8, or no more than 1.6, or no more than 1.5, or no more than 1.4, or no more than 1.3, or no more than 1.2, or no more than 1.1, or no more than 1.0, or no more than 0.9.

Preferably, the value of $P_1$ may be, for instance, in the range from 0.6 to 1.4, or in the range from 0.65 to 1.4, or in the range from 0.7 to 1.4, or in the range from 0.75 to 1.4, or in the range from 0.7 to 1.3, or in the range from 0.75 to 1.3, or in the range from 0.7 to 1.2, or in the range from 0.75 to 1.2, or in the range from 0.7 to 1, or in the range from 0.75 to 1, or in the range from 0.7 to 0.9, or in the range from 0.75 to 0.9.

The $PD_{50}$ pore diameter of porous carbon framework 3 is preferably no more than 1.8 nm, or no more than 1.6 nm, or no more than 1.4 nm, or no more than 1.2 nm, or no more than 1 nm.

Preferably, at least 80% of the total micropore and mesopore volume of porous carbon framework 3 is in the form of pores having a diameter of no more than 5 nm. Accordingly, the $PD_{80}$ pore diameter of porous carbon framework 3 is preferably no more than 5 nm, or no more than 4.5 nm, or no more than 4 nm, or no more than 3.5 nm, or no more than 3 nm, or no more than 2.5 nm, or no more than 2.2 nm, or no more than 2 nm, or no more than 1.8 nm, or no more than 1.6 nm.

The $PD_{90}$ pore diameter is preferably no more than 10 nm, or no more than 8 nm, or no more than 6 nm, or no more than 5 nm, or no more than 4 nm, or no more than 3 nm, or no more than 2.5 nm, or no more than 2 nm.

Preferably, the $PD_{95}$ pore diameter is no more than 15 nm, or no more than 12 nm, or no more than 10 nm.

CVI/FBR

A lab-scale FBR may be used for contacting the porous carbon frameworks with a gas mixture containing a gaseous precursor of an electroactive material (e.g. silane) to deposit the electroactive material via CVI in the micropores and/or mesopores of the frameworks.

Nitrogen gas may be used as the inert fluidising gas but other inert gases such as argon, hydrogen, or helium can also be used. It will be understood that the porous carbon frameworks are fluidised in the FBR in the process of the invention.

The process of the invention uses CVI of a gaseous precursor of an electroactive material into the pore structure of the porous carbon framework. Preferably, the gaseous precursor is a silicon-containing gas.

Suitable silicon-containing precursors include silane ($SiH_4$), disilane ($Si_2H_6$), trisilane ($Si_3H_8$), tetrasilane ($Si_4H_{10}$), or chlorosilanes such as trichlorosilane ($HSiCl_3$) or methylchlorosilanes such as methyltrichlorosilane ($CH_3SiCl_3$) or dimethyldichlorosilane (($CH_3)_2SiCl_2$). Preferably the silicon-containing precursor is silane.

The CVI process may also utilise a gaseous precursor of a dopant material to deposit a doped electroactive material into the micropores and/or mesopores of the porous carbon frameworks.

When the dopant is boron suitable precursors include borane ($BH_3$), triisopropyl borate ($[(CH_3)_2CHO]_3B$), triphenylborane (($C_6H_5)_3B$), and tris(pentafluorophenyl)borane ($C_6F_5)_3B$, preferably borane. When the dopant is phosphorous a suitable precursor is phosphine ($PH_3$).

The precursors may be used either in pure form or more usually as a diluted mixture with an inert carrier gas, such as nitrogen or argon. For instance, the precursor may be used in an amount in the range from 0.5 to 20 vol %, or 1 to 10 vol %, or 1 to 5 vol % based on the total volume of the precursor and the inert carrier gas. The CVI process is suitably carried out at low partial pressure of gaseous precursor with total pressure at or below atmospheric pressure (101.3 kPa) (for instance in the range of 50 to 101.3 kPa), the remaining partial pressure made up to atmospheric pressure using an inert padding gas such as hydrogen, nitrogen or argon.

The temperature of the CVI process is chosen to pyrolyse the precursor to the electroactive material. The CVI process is suitably performed at temperature in the range from 200 to 1,250° C., or in the range from 400 to 700° C., or in the range from 400 to 600° C., or in the range from 400 to 550° C., or in the range from 450 to 550° C., or in the range from 450 to 500° C. Preferably the CVI process is performed at a temperature in the range from 400 to 500° C., preferably from 400 to 450° C. or from 450 to 500° C. The CVI process is preferably carried out at or above minimum fluidization velocity (Umf) of the particulate material. Preferably, the superficial velocity is above the minimum fluidization velocity (Umf) of the particulate material. The minimum fluidization velocity (Umf) is typically a measured quantity and its value varies depending on the particle size, particle density, and gas viscosity. The minimum fluidization velocity defines the flow rate of the gas that has to be supplied to the reactor vessel to achieve the velocity that lifts the particles to a "fluid-like" state. Flow rate of the CVI process is suitably chosen to provide a good solid-solid and solid-gas mixing and with minimum particle carry-over from the reactor. The CVI process is suitably performed in the range 1 to 20 times the minimum fluidization velocity (Umf).

Without wishing to be bound by theory, it is believed that the infiltration of the electroactive material is under kinetic control when the porous carbon framework particle size is controlled in the manner discussed above. It is believed that the kinetic control of infiltration will result in a composite particle with a uniform distribution of electroactive material throughout. This may, after a certain amount of the electroactive material is deposited, lead to occlusion of pores throughout the volume of the framework. Controlling the particle size of the porous carbon frameworks has the advantage of allowing a high infiltration efficiency at the temperature and concentration range used in the CVI process; whilst also rendering the frameworks amenable to fluidisation in the classical sense (such as the Geldert A group).

Comminution

The process of the invention includes a step of comminuting the intermediate particles to provide said composite particles. The comminuting step is such that the particle size of the composite particles is lower than the particle size of the particulate porous carbon frameworks. A benefit of the invention is that the comminuting step allows for the use of CVI in an FBR, which is a process suitable for large-scale commercial use, while providing a final product with a low particle size suitable for use in metal-ion batteries.

Some agglomeration of the porous carbon frameworks may occur during the CVI process in the FBR. Accordingly, the particle size of the intermediate particles may be higher than the particle size of the porous carbon frameworks.

The comminuting can be done by different types of comminuting device such as mill such as wet mill, ball milling, jet milling, high-shear stirring, ultrasound etc. Preferably, the comminuting is performed in a dry mill due to the reactivity of the intermediate particles immediately after infiltration has finished, since the electroactive material deposited by the CVI process may be reactive. For example, silicon deposited from silane contains a significant amount of Si—H bonds. These bonds are reactive towards organic molecules and water. Accordingly, the presence of oxygen or an organic solvent may result in an exothermic reaction leading to partial destruction of the Si/C composite material and/or degradation below the quality required for commercial metal-ion battery material.

Among the dry mills, jet mills are preferred because of capability to grind to lower sizes. Jet mills use a high speed jet of compressed air or inert gas to impact particles with each other. Jet mills can be used with starting material with a size up to about 1 mm and are known to readily achieve sizes of the order of 1 µm with relatively little energy input.

There are different types of jet mills, e.g. rotational types (cyclic motion) and fluidised opposed-jet types. In the rotational type, particles are accelerated by using tangential gas force from the walls. The fluidised opposing-jet works by multiples of jet separated at equal angles from each other and works on colliding particles on collision trajectory towards each other. Fluidised opposing-jet type mills are more suitable when a higher capacity is desired. The grinding action in both types of mills is achieved by collision of particles with each other rather than with a hard target. This specific mode of action results in a comminuted product with narrow particle size distribution which is beneficial for incorporation into a metal-ion battery electrode. Additionally, the comminuted product has high purity when an inert grinding gas of controlled composition (limited oxygen and water content) is used.

Either a rotational jet mill (e.g. a spiral jet mill) or fluidised opposed jet-mill design can be used with a diameter of 0.04 m up to several meters, with grinding gas pressure between 50 and 1000 kPa, and a maximum starting particle size of 1 mm. The grinding gas is either an inert gas such as nitrogen or argon, or a mixture of these with a low partial pressure of air, water or oxygen.

The comminuted particles may optionally be classified according to size, for instance by centrifugation or by sieving.

The intermediate particles may be passivated before the comminution step. That is, the particle surfaces may be treated to reduce their chemical reactivity, preferably to minimise or prevent any further oxidation of the particle surfaces in subsequent process steps or handling. For example, the intermediate particles may be passivated in a low oxygen concentration environment such as where the oxygen concentration is less than 10 vol % oxygen. An inert gas such as nitrogen may be used to passivate the intermediate particles. A low-oxygen concentration gas mixture may also be used. Passivating the intermediate particles has the advantage that unwanted further reaction of the intermediate particle is suppressed. For example, passivating the intermediate particles may remove the reactive Si—H bonds. This helps maintain the structure of the electroactive material deposited in the pores of porous carbon frameworks derived from the CVI process, which is beneficial when the composite particles are used in metal-ion batteries. The comminution step may also be performed in a low oxygen concentration environment, such as in an inert gas or a low-oxygen concentration gas mixture. Conveniently, the commination step can be performed in the same atmosphere as the optional passivating step.

The intermediate particles may be cooled before the comminution step, optionally in combination with the passivating step. The cooling may be to a temperature of below 100° C., or below 50° C., or to ambient temperature. Cooling the intermediate particles has the advantage of facilitating the transfer of the intermediate particles to the comminuting device.

The process of the invention may be a continuous process or a batch process. In a continuous process, the passivation and cooling steps need to be performed in a separate vessel to the FBR. The separate vessel to the FBR may be the comminuting device.

Composite Particle Product

It is a benefit of the invention that the properties of the composite particle product may be controlled by choosing the properties of the porous carbon framework starting material. This is achieved because the inventors have found that comminution may occur without a significant level of damage due to the relative μm-length scale of fracture compared to the nm-length scale of the functional unit of the composite particles. In other words, the comminution step provides the desired particle size for the composite particle product, while maintaining the desirable nanostructure obtained from using CVI to deposit the electroactive material into the porous carbon framework comprising micropores and/or mesopores. For instance, both the intermediate particles and the composite particles may comprise a plurality of nanoscale domains of the elemental form of the electroactive material located within the micropores and/or mesopores of the porous carbon frameworks. As used herein, the term "nanoscale domain" refers to a nanoscale body of electroactive material that is located within the pores of the porous carbon framework. The maximum dimensions of the nanoscale silicon domains are defined by the pore diameters of the pores in which the silicon is located.

The composite particles in general terms are a particulate material in which nanoscale domains of the electroactive material occupy the pore volume of a porous carbon framework in which the pore volume includes micropores and/or mesopores. It has been found that this particle architecture provides an electroactive material with very high gravimetric and volumetric capacity on lithiation and high reversible capacity retention over multiple charge-discharge cycles.

Without being bound by theory, it is believed that locating nanoscale electroactive domains within micropores and/or mesopores firstly provides fine electroactive structures which are able to lithiate and delithiate without excessive structural stress. It is believed that these very fine electroactive domains have a lower resistance to elastic deformation and higher fracture resistance than larger electroactive structures. By ensuring that a relatively high proportion of the pore volume is occupied by the electroactive material, the composite particles may have a high capacity. Furthermore, by locating nanoscale electroactive domains within micropores and/or mesopores only a small area of electroactive surface is accessible to electrolyte and SEI formation is therefore limited.

In some cases, the composite particles produced by the invention may include pores in which fully enclosed void space is capped by the electroactive material, such that electrolyte access into the void space is prevented.

The particle size of the composite particles may be targeted by controlling the comminution step, and optionally the step of classifying the particles according to size, to provide a desired particle size distribution for the end-use.

The $D_{50}$ particle diameter of the composite particles is less than the $D_{50}$ particle diameter of the porous carbon frameworks as a result of the comminution of the intermediate particles in step (c). Thus, the composite particle obtained in step (c) may have a $D_{50}$ particle diameter of, for instance, up to 50 μm, so long as the $D_{50}$ particle diameter of the porous carbon framework is larger still. For example, the composite particles may have a $D_{50}$ particle diameter of no more than 40 μm, or no more than 30 μm, or no more than 25 μm.

It is preferred that the composite particles may have a $D_{50}$ particle diameter of no more than 20 μm. For example, the composite particles may have a $D_{50}$ particle diameter of no more than 15 μm, or no more than 12 μm, or no more than 10 μm, or no more than 9 μm, or no more than 8 μm, or no more than 7 μm, or no more than 6.5 μm, or no more than 6 μm, or no more than 5.5 μm, or no more than 5 μm, or no more than 4.5 μm, or no more than 4 μm, or no more than 3.5 μm.

The composite particles may have a $D_{50}$ particle diameter of at least 1 μm, or at least 2 μm, or at least 3 μm, or at least 4 μm, or at least 5 μm.

Preferably, the composite particles have a $D_{50}$ particle diameter in the range from 0.5 to 20 μm, or in the range from 0.5 to 15 μm, or in the range from 0.5 to 12 μm, or in the range from 0.5 to 10 μm, or in the range from 0.5 to 8 μm, or in the range from 0.5 to 9 μm, or in the range from 0.5 to 7 μm. Composite particles within these size ranges and having porosity and a pore diameter distribution as set out herein are ideally suited for use in anodes for metal-ion batteries due to their dispersibility in slurries, their structural robustness, their capacity retention over repeated charge-discharge cycles, and their suitability for forming dense electrode layers of uniform thickness in the conventional range from 20 to 50 μm.

The composite particles may have a $D_{10}$ particle diameter of at least 0.2 μm, or at least 0.5 μm, or at least 0.8 μm, or at least 1 μm, or at least 1.5 μm, or at least 2 μm.

The composite particles may have a $D_{90}$ particle diameter of no more than 40 μm, or no more than 30 μm, or no more than 20 μm, or no more than 15 μm, or no more than 10 μm, or no more than 8 μm, or no more than 6 μm.

Preferably, the porous carbon frameworks in step (a) have $D_{50}$ particle diameter of at least 30 μm and the composite particles obtained in step (c) have a $D_{50}$ particle diameter of no more than 20 μm. More preferably, the porous carbon frameworks in step (a) have $D_{50}$ particle diameter of at least 40 μm and the composite particles obtained in step (c) have a $D_{50}$ particle diameter of no more than 20 μm. More preferably, the porous carbon frameworks in step (a) have $D_{50}$ particle diameter of at least 50 μm and the composite particles obtained in step (c) have a $D_{50}$ particle diameter of no more than 20 μm.

Preferably, the composite materials of the invention have a BET surface area of no more than 300 $m^2/g$, or no more than 250 $m^2/g$, or no more than 200 $m^2/g$, or no more than 150 $m^2/g$, or no more than 100 $m^2/g$, or no more than 80 $m^2/g$, or no more than 60 $m^2/g$, or no more than 40 $m^2/g$, or no more than 30 $m^2/g$, or no more than 25 $m^2/g$, or no more than 20 $m^2/g$, or no more than 15 $m^2/g$, or no more than 10 $m^2/g$. In general, a low BET surface area is preferred in order to minimise the formation of solid electrolyte interphase (SEI) layers at the surface of the composite particles during the first charge-discharge cycle of an anode comprising the particulate material of the invention. However, a BET surface area which is excessively low results in unacceptably low charging rate and capacity due to the inaccessibility of the bulk of the electroactive material to metal ions in the surrounding electrolyte. For instance, the BET surface area is preferably at least 0.1 $m^2/g$, or at least 1 $m^2/g$, or at least 2 $m^2/g$, or at least 5 $m^2/g$. For instance, the BET surface area may be in the range from 1 $m^2/g$ to 25 $m^2/g$, more preferably in the range from 2 to 15 $m^2/g$.

Preferably at least 90 wt %, more preferably at least 95 wt %, more preferably at least 98 wt %, more preferably at least 99 wt % of the electroactive mass in the composite particles is located within the internal pore volume of the porous carbon framework such that there is no or very little electroactive material located on the external surface of the composite particles.

Preferably, the volume of micropores and mesopores in the composite particles (i.e. in the presence of the electroactive material), as measured by nitrogen gas adsorption, is no more than $0.15 \times P_1$, or no more than $0.10 \times P_1$, or no more than $0.05 \times P_1$, or no more than $0.02 \times P_1$.

The weight ratio of the electroactive material, such as silicon, to the porous carbon framework in the composite particles can be determined by elemental analysis. Elemental analysis is used to determine the weight percentages of both the electroactive material and carbon in the composite particles. Optionally, the amounts of hydrogen, nitrogen and oxygen may also be determined by elemental analysis. Preferably, elemental analysis is also used to determine the weight percentage of carbon (and optionally hydrogen, nitrogen and oxygen) in the porous carbon framework alone. Determining the weight percentage of carbon in the in the porous carbon framework alone takes account of the possibility that the porous carbon framework contains a minor amount of heteroatoms within its molecular framework. Both measurements taken together allow the weight percentage of silicon relative to the entire porous carbon framework to be determined reliably.

The electroactive material (e.g. silicon) content is preferably determined by ICP-OES (Inductively coupled plasma-optical emission spectrometry). A number of ICP-OES instruments are commercially available, such as the iCAP® 7000 series of ICP-OES analyzers available from ThermoFisher Scientific. The carbon content of the composite particles and of the porous carbon framework alone (as well as the hydrogen, nitrogen and oxygen content if required) are preferably determined by IR absorption. A suitable instrument for determining carbon, hydrogen, nitrogen and oxygen content is the TruSpec® Micro elemental analyser available from Leco Corporation.

Suitably, when the electroactive material is silicon, the composite particles comprise 30 to 80 wt % silicon, preferably 45 to 65 wt % silicon.

The composite particles preferably have a low total oxygen content. Oxygen may be present in the composite particles for instance as part of the porous carbon framework or as an oxide layer on any exposed silicon surfaces. Preferably, the total oxygen content of the composite particles is less than 15 wt %, more preferably less than 10 wt %, more preferably less than 5 wt %, for example less than 2 wt %, or less than 1 wt %, or less than 0.5 wt %.

When the electroactive material is silicon, the weight ratio of silicon to the porous carbon framework in the composite particles is preferably in the range from $[0.5 \times P_1$ to $2.2 \times P_1]$:1. This relationship takes into account the density of silicon and the pore volume of the porous carbon framework to define a weight ratio of silicon at which the pore volume is around 20 vol % to 95 vol % occupied by silicon.

The composite particles typically have a specific charge capacity on first lithiation of 1200 to 2340 mAh/g. Preferably the composite particles have a specific charge capacity on first lithiation of at least 1400 mAh/g.

As discussed above, certain classes of composite particle product can be targeting by using certain classes of porous carbon frameworks. It will be understood that the pore structure of the porous carbon frameworks, such as the micropores and/or mesopores, will be retained in the composite particle product. Certain classes of composite particle product are discussed below. It will be understood that the features of the classes of composite particles discussed below are to be considered in combination with the features of the composite particles discussed above, such as the particle size.

Composite Particles 1

Composite particles 1 produced by the process of the invention comprise:
  (a) a porous carbon framework comprising micropores and/or mesopores, wherein the micropores and/or mesopores have a total pore volume as measured by gas adsorption of $P_1$ cm$^3$/g, wherein $P_1$ represents a natural number having a value of at least 0.7, and
     wherein the $PD_{50}$ pore diameter as measured by gas adsorption is no more than 5 nm; and
  (b) a plurality of elemental nanoscale silicon domains located within the micropores and/or mesopores of the porous carbon framework;
wherein the weight ratio of silicon to the porous carbon framework in the composite particles is in the range from $[0.5 \times P_1$ to $1.3 \times P_1]$:1. This corresponds to a silicon volume that is approximately 20 to 55% of the total micropore/mesopore volume (in the uncharged state).

Composite particles 1 may be produced using porous carbon frameworks 1 as the starting material. Therefore, the pore structure of the porous carbon frameworks 1 may be present in composite particles 1.

Preferably, the weight ratio of silicon to carbon is in the range from $[0.55 \times P_1$ to $1.1 \times P_1]$:1, or in the range from $[0.6 \times P_1$ to $1.1 \times P_1]$:1, or in the range from $[0.6 \times P_1$ to $1 \times P_1]$:1, or in the range from $[0.6 \times P_1$ to $0.95 \times P_1]$:1, or in the range from $[0.6 \times P_1$ to $0.9 \times P_1]$:1, or in the range from $[0.65 \times P_1$ to $0.9 \times P_1]$:1, or in the range from $[0.65 \times P_1$ to $0.85 \times P_1]$:1, or in the range from $[0.65 \times P_1$ to $0.8 \times P_1]$:1, or in the range from $[0.7 \times P_1$ to $0.8 \times P_1]$:1.

Preferably, silicon occupies from about 25% to about 45%, more preferably from about 25% to 40% of the internal pore volume of the porous carbon framework. Within these preferred ranges, the pore volume of the porous carbon framework is effective to accommodate expansion of the silicon during charging and discharging, but avoids excess pore volume which does not contribute to the volumetric capacity of the particulate material. However, the amount of silicon is also not so high as to impede effective lithiation due to inadequate metal-ion diffusion rates or due to inadequate expansion volume resulting in mechanical resistance to lithiation.

The composite particles 1 may have a $D_{50}$ particle diameter in the range from 0.5 to 50 µm. Optionally the $D_{50}$ particle diameter may be no more than 20 µm.

For instance, the composite particles 1 may have a $D_{50}$ particle diameter in the range from 1 to 25 µm, or in the range from 1 to 20 µm, or in the range from 2 to 20 µm, or in the range from 2 to 15 µm, or in the range from 3 to 15 µm.

Composite Particles 2 Composite particles 2 produced by the process of the invention comprise:
  (a) a porous carbon framework comprising micropores and mesopores, wherein
     (i) the micropores and mesopores have a total pore volume as measured by gas adsorption of $P_1$ cm$^3$/g, wherein $P_1$ has a value of at least 0.6,
     (ii) the volume fraction of micropores ($\varphi_a$) is in the range from 0.1 to 0.9, based on the total volume of micropores and mesopores;
     (iii) the volume fraction of pores having a pore diameter no more than 20 nm ($\varphi_{20}$) is at least 0.75, based on the total volume of micropores and mesopores, and (iv) the porous carbon framework has a $D_{50}$ particle size of less than 20 μm;

(b) a plurality of nanoscale elemental silicon domains located within the micropores and/or mesopores of the porous carbon framework;

wherein the weight ratio of silicon to the porous carbon framework in the composite particles is in the range from $[1 \times P_1$ to $2.2 \times P_1]:1$.

Composite particles 2 may be produced using porous carbon frameworks 2 as the starting material. Therefore, the pore structure of the porous carbon frameworks 2 may be present in composite particles 2.

Composite particles 2 are particularly suitable for use in "hybrid" electrodes comprising a combination of graphite and the composite particles.

The weight ratio of silicon to the porous carbon framework in the composite particles is in the range from $[1 \times P_1$ to $2.2 \times P_1]:1$. A weight ratio of $[1 \times P_1]:1$ corresponds to around 43% v/v occupancy of the pores of the porous carbon framework by silicon, taking into account silicon density of around 2.3 g/cm³. The upper limit of the ratio at $[2.2 \times P_1]:1$ corresponds to around 95% v/v occupancy of the pores of the porous carbon framework by silicon.

Preferably, the weight ratio of silicon to the porous carbon framework is at least $1.1 \times P_1$, more preferably at least $1.15 \times P_1$, more preferably at least $1.2 \times P_1$, more preferably at least $1.25 \times P_1$, more preferably at least $1.3 \times P_1$, more preferably at least $1.35 \times P_1$, more preferably at least $1.4 \times P_1$.

Where the porous carbon framework comprises a relatively higher ratio of mesopores to micropores, (for instance where $\varphi_a$ is in the range from 0.2 to 0.5, or in the range from 0.3 to 0.5), the weight ratio of silicon to carbon may be higher still, for example at least $1.45 \times P_1$, more preferably at least $1.5 \times P_1$, more preferably at least $1.55 \times P_1$, more preferably at least $1.6 \times P_1$, more preferably at least $1.65 \times P_1$, more preferably at least $1.5 \times P_1$.

In further preferred embodiments, the minimum weight ratio of silicon to the porous carbon framework is at least the value given by $[\varphi_b + 0.75] \times P_1$, or at least the value given by $[\varphi_b + 0.8] \times P_1$, or at least the value given by $[\varphi_b + 0.9] \times P_1$, or at least the value given by $[\varphi_b + 1] \times P_1$, or at least the value given by $[\varphi_b + 1.1] \times P_1$. Thus, in the case that the mesopore fraction $\varphi_b$ has a higher value, the amount of silicon in composite particles 2 is also higher. This correlation between mesopore fraction and the minimum weight ratio of silicon to the porous carbon framework ensures that porous carbon frameworks having higher mesopore fractions are occupied by silicon to a higher extent, thus optimising the volumetric capacity of composite particles 2. Ensuring that porous carbon frameworks having higher mesopore fractions have a higher minimum silicon loading also reduces the possibility that larger micropores will be partially occupied by silicon, thus reducing the silicon surface area that is exposed to the electrolyte and thereby limiting undesirable SEI formation.

In further embodiments, the maximum weight ratio of silicon to the porous carbon framework is no more than the value given by $[\varphi_b + 1.6] \times P_1$, more preferably no more than the value given by $[\varphi_b + 1.5] \times P_1$. The correlation between mesopore fraction and the maximum weight ratio of porous carbon framework ensures that that porous carbon frameworks having higher micropore fractions are not excessively filled by silicon.

Composite particles 2 may have a $D_{50}$ particle diameter in the range from 0.5 to 20 μm. Preferably, the $D_{50}$ particle diameter of composite particles 2 is no more than 12 μm, or no more than 10 μm, or no more than 8 μm.

For instance, composite particles 2 may have a $D_{50}$ particle diameter in the range from 1 to 12 μm, or from 1 to 10 μm, or from 2 to 10 μm, or from 3 to 8 μm.

The $D_{10}$ particle diameter of composite particles 2 is preferably at least 0.5 μm.

The $D_{90}$ particle diameter of composite particles 2 is preferably no more than 12 μm, or no more than 10 μm.

Composite Particles 3

Composite particles 3 produced by the process of the invention comprise:

(a) a porous carbon framework comprising micropores and/or mesopores,
wherein the micropores and mesopores have a total pore volume as measured by gas adsorption of at least 0.7 cm³/g,
wherein the $PD_{50}$ pore diameter as measured by gas adsorption is no more than 2 nm; and (b) an electroactive material located within the micropores and/or mesopores of the porous carbon framework;

wherein the composite particles have a $D_{90}$ particle diameter of no more than 10 μm.

Composite particles 3 may be produced using porous carbon frameworks 3 as the starting material. Therefore, the pore structure of the porous carbon frameworks 3 may be present in composite particles 3.

Composite particles 3 relate to a particulate material in which the porous carbon framework has relatively high total volume of micropores and mesopores, with pores having a diameter of no more than 2 nm constituting at least 50% of the total pore volume. This pore structure may be derived from porous carbon frameworks 3. Composite particles 3 have a particle size distribution that is heavily weighted towards particles with diameters of no more than 10 μm. It has been found that the combination of small particles size together with a highly divided pore volume provides an electroactive material with high resistance to mechanical degradation during electrode manufacture.

The $D_{90}$ particle diameter of composite particles 3 is preferably no more than 9.5 μm, or no more than 9 μm, or no more than 8.5 μm, or no more than 8 μm, or no more than 7.5 μm, or no more than 7 μm, or no more than 6.5 μm, or no more than 6 μm, or no more than 5.5 μm, or no more than 5 μm, or no more than 4.5 μm, or no more than 4 μm.

Composite particles 3 preferably have a $D_{50}$ particle diameter in the range from 0.5 to 7 μm. Optionally, the $D_{50}$ particle diameter may be at least 1 μm, or at least 1.5 μm, or at least 2 μm, or at least 2.5 μm, or at least 3 μm.

Optionally the $D_{50}$ particle diameter may be no more than 6.5 μm, or no more than 6 μm, or no more than 5.5 μm, or no more than 5 μm, or no more than 4.5 μm, or no more than 4 μm, or no more than 3.5 μm.

For instance, composite particles 3 may have a $D_{50}$ particle diameter in the range from 1 to 6.5 μm, or in the range from 1.5 to 6 μm, or in the range from 2 to 5.5 μm, or in the range from 2.5 to 5 μm, or in the range from 3 to 4.5 μm.

The $D_{10}$ particle diameter of composite particles 3 is preferably at least 0.5 μm.

The $D_{99}$ particle diameter of composite particles 3 is preferably no more than 25 μm.

The amount of electroactive material in composite particles 3 is preferably selected such that no more than about 55% of the internal pore volume of the porous carbon framework is occupied by the electroactive material (in the uncharged state). Preferably, the electroactive material occupies from about 25% to about 45% of the internal pore volume of the porous carbon framework, more preferably from about 25% to 40% of the internal pore volume of the porous carbon framework.

Where the electroactive material is silicon, the weight ratio of silicon to the porous carbon framework is preferably $[0.5 \times P_1$ to $1.3 \times P_1]:1$. More preferably, the weight ratio of silicon to carbon is in the range from $[0.55 \times P_1$ to $1.1 \times P_1]:1$, or in the range from $[0.6 \times P_1$ to $1.1 \times P_1]:1$, or in the range from $[0.6 \times P_1$ to $1 \times P_1]:1$, or in the range from $[0.6 \times P_1$ to $0.95 \times P_1]:1$, or in the range from $[0.6 \times P_1$ to $0.9 \times P_1]:1$, or in the range from $[0.65 \times P_1$ to $0.9 \times P_1]:1$, or in the range from $[0.65 \times P_1$ to $0.85 \times P_1]:1$, or in the range from $[0.65 \times P_1$ to $0.8 \times P_1]:1$, or in the range from $[0.7 \times P_1$ to $0.8 \times P_1]:1$.

Carbon Coating

The process of the invention may optionally include a further step comprising depositing a conductive coating, preferably a carbon-based coating, on the composite particles. Suitably a conductive carbon-based coating may be obtained by a chemical vapour deposition (CVD) method. CVD is a well-known methodology in the art and comprises the thermal decomposition of a volatile carbon-containing gas (e.g. ethylene) onto the surface of the particulate material. Alternatively, the carbon-based coating may be formed by depositing a solution of a carbon-containing compound onto the surface of the particulate material followed by pyrolysis. The conductive coating (such as a carbon-based coating) is sufficiently permeable to allow lithium access to the interior of the composite particles without excessive resistance, so as not to reduce the rate performance of the composite particles. For instance, the thickness of the conductive coating may suitably be in the range from 2 to 30 nm. Optionally, the conductive coating may be porous and/or may only cover partially the surface of the composite particles.

A conductive coating has the advantages that it further reduces the BET surface area of the composite particles by smoothing any surface defects and by filling any remaining surface microporosity, thereby further reducing first cycle loss. In addition, a conductive coating improves the electronic conductivity of the surface of the composite particles, reducing the need for conductive additives in the electrode composition, and also creates an optimum surface for the formation of a stable SEI layer, resulting in improved capacity retention on cycling.

Preferably the BET surface area of the composite particles after depositing the conductive coating is less than 50, less than 30, less than 20, more preferably less than 10, or less than 5 m$^2$/g.

End-Use of Product

The process of the invention may optionally include a further step of forming an electrode composition comprising the composite particles (optionally wherein the composite particles have been coated with a conductive carbon coating). The electrode composition may comprise at least one other component selected from: (i) a binder; (ii) a conductive additive; and (iii) an additional particulate electroactive material.

The process of the invention may optionally include a further step of forming a slurry comprising the composite particles (optionally wherein the composite particles have been coated with a conductive carbon coating) and a solvent.

Product-by-Process

The invention also provides a particulate material comprising composite particles obtainable by the process of the invention. The nanostructure of the electroactive material deposited by the CVI process of the invention is different to the nanostructure of an electroactive material deposited by other means. Moreover, because the composite particles arise from a CVI process and a subsequent comminution process they can be distinguished from particles of a similar size prepared without the subsequent comminution step. For instance, the communion step gives rise to fracture surfaces which may be observed via microscopy. Accordingly, the composite particles obtainable from the process of the invention can be distinguished from composite particles obtained by other means.

EXAMPLE

Silicon-carbon composite materials were synthesized in a vertical bubble-fluidised bed reactor comprising an 83 mm internal diameter stainless steel cylindrical vessel. The reactor was dosed with 126 g of a pre-mixed mixture of porous carbon particle with BET surface area of 1777 m$^2$/g, total pore volume of 0.78 cm$^3$/g, PD$_{10}$=0.97 nm, PD$_{50}$=1.15 nm, PD$_{90}$=2.23 nm and $\varphi_a$=61%. An inert gas (nitrogen) at a low flow rate was injected into the reactor to remove any oxygen. The reactor was then heated to a reaction temperature between 42° and 440° C. and 1.25% v/v monosilane gas diluted in nitrogen was supplied to the bottom of the reactor at a flow rate sufficient to fluidize the carbon framework particles, for a duration of 32.3 hours (Sample 1) or 37 hours (Sample 2). Once reaction time was complete, the reactor atmosphere was switched to pure nitrogen whilst maintaining fluidisation, this purge lasted 30 minutes. After this the furnace was ramped to ambient temperature over several hours. On reaching ambient temperature, the furnace atmosphere was switched to air gradually over a period of hours.

The product was added to the feed tray of a MC DecJet® 30 mill and the grinding took place in an inert atmosphere. The ring pressure was set at 650 kPa and the Venturi pressure was set at 700 kPa. The product was micronized and then collected in a suitable container. The material characteristics of the two composite materials are given in Table 1.

TABLE 1

| Sample | BET (m$^2$/g) | Si wt % | C wt % | O wt % | Si:C ratio | Particle size distribution | | |
|---|---|---|---|---|---|---|---|---|
| | | | | | | D$_{10}$ | D$_{50}$ | D$_{90}$ |
| Sample 1 | 173 | 45.0 | 38.6 | 14.3 | 1.17 | 1.2 | 4.2 | 15.6 |
| Sample 2 | 100 | 51.9 | 35.4 | 12.3 | 1.47 | 1.1 | 3.2 | 8.1 |

Preparation of Negative Electrodes

Negative electrode coatings (anodes) were prepared from each of the materials of Sample 1 and 2. A dispersion of carbon black SuperP® (conductive carbon) in CMC binder was mixed in a Thinky™ mixer. The Si—C composite material was added to the mixture and mixed for 30 min in the Thinky™ mixer. SBR binder was then added to give a CMC:SBR ratio of 1:1, yielding a slurry with a weight ratio of Si—C composite material: CMC/SBR: carbon black of 70%:16%:14%. The slurry was further mixed for 30 min in the Thinky™ mixer, then was coated onto a 10 μm thick copper substrate (current collector) and dried at 50° C. for 10 minutes, followed by further drying at 110° C. for 12 hours to thereby form a negative electrode.

Cell Manufacture and Cycling
Full Cell Manufacture

Full coin cells were made using circular negative electrodes of 0.8 cm radius cut from the coatings made with Samples 1 and 2 (as described above), a porous polyethylene separator and a nickel manganese cobalt (NMC532) positive electrode. The positive and negative electrodes were designed to form a balanced pair, such that the capacity ratio of the positive to negative electrodes was 0.9. An electrolyte comprising 1 M $LiPF_6$ in a 7:3 solution of EMC/FEC (ethylene methyl carbonate/fluoroethylene carbonate) containing 3 wt % vinylene carbonate was then added to the cell before sealing.

The coin cells were cycled as follows: A constant current was applied at a rate of C/25, to lithiate the anode, with a cut off voltage of 4.3 V. When the cut off was reached, a constant voltage of 4.3 V is applied until a cut off current of C/100 is reached. The cell was then rested for 10 minutes in the lithiated state. The anode is then delithiated at a constant current of C/25 with a cut off voltage of 2.75 V. The cell was then rested for 10 minutes. After this initial cycle, a constant current of C/2 was applied to lithiate the anode with a 4.3 V cut off voltage, followed by a 4.3 V constant voltage with a cut off current of C/40 with rest time of 5 minutes. The anode was then delithiated at a constant current of C/2 with a 2.75V cut off. This was then repeated for the desired number of cycles.

The charge (lithiation) and discharge (delithiation) capacities for each cycle are calculated per unit mass of the silicon-carbon composite material and the capacity retention value is calculated for each discharge capacity as a percentage of the discharge capacity on the second cycle. The first cycle loss (FCL) is $(1-(1^{st}$ delithiation capacity/$1^{st}$ lithiation capacity))$\times 100\%$. The key values are averaged over 3 coin cells for each material and are listed in Table 2.

TABLE 2

| Composite Material in Negative Electrode | Average 1st Lithiation capacity (mAh/g) | Average 1st De-Lithiation (mAh/g) | Average First cycle loss, FCL % | Capacity Retention @500 cycles/% (with variation between cells) |
|---|---|---|---|---|
| Sample 1 | 1967 ± 5 | 1327 ± 8 | 32.5 ± 0.6 | 65 ± 3 |
| Sample 2 | 2064 ± 8 | 1470 ± 10 | 28.8 ± 0.2 | 58 ± 4 |

The invention claimed is:

1. A process for preparing composite particles, the process comprising:
   (a) providing particulate porous carbon frameworks comprising micropores and/or mesopores, wherein the porous carbon frameworks have a $D_{50}$ particle diameter of at least 20 μm;
   (b) depositing an electroactive material selected from silicon, tin, aluminium, germanium and alloys thereof into the micropores and/or mesopores of the porous carbon frameworks using chemical vapour infiltration while the porous carbon frameworks are in a fluidized state, to provide intermediate particles;
   (c) comminuting the intermediate particles to provide said composite particles; and
   (d) depositing a conductive coating on the composite particles from step (c) to produce coated composite particles.

2. The process according to claim 1, wherein the conductive coating is a carbon-based conductive coating.

3. The process according to claim 2, wherein the carbon-based conductive coating is obtained by chemical vapour deposition.

4. The process according to claim 2, wherein the carbon-based conductive coating is formed by depositing a solution of carbon-containing compound onto the surface of the particulate material followed by pyrolysis.

5. The process according to claim 1, wherein the conductive coating has a thickness of 2 to 30 nm.

6. The process according to claim 1, wherein the BET surface area of the coated composite particles after step (d) is less than 50 $m^2$/g.

7. The process according to claim 1, further comprising transferring the intermediate particles into a comminuting device prior to step (c).

8. The process according to claim 1, wherein the electroactive material is silicon.

9. The process according to claim 4, wherein the intermediate particles, the composite particles, and the coated composite particles comprise a plurality of nanoscale electroactive domains located within the micropores and/or mesopores of the porous carbon frameworks.

10. The process according to claim 1, wherein the chemical vapour infiltration process comprises contacting the porous carbon frameworks with a silicon-containing precursor.

11. The process according to claim 10, wherein the silicon-containing precursor gas is selected from the group consisting of silane ($SiH_4$), disilane ($Si_2H_6$), trisilane ($Si_3H_8$), tetrasilane ($Si_4H_{10}$), chlorosilanes such as trichlorosilane ($HSiCl_3$), methylchlorosilanes such as methyltrichlorosilane ($CH_3SiCl_3$) or dimethyldichlorosilane (($CH_3)_2SiCl_2$), preferably wherein the silicon-containing precursor gas is silane.

12. The process according to claim 1, wherein the chemical vapour infiltration process is performed at a temperature in the range from 200 to 1,250° C.

13. The process according to claim 12, wherein the chemical vapour infiltration process is performed at a temperature in the range from 200 to 500° C.

14. The process according to claim 13, wherein the chemical vapour infiltration process is performed at a temperature in the range from 400 to 500° C.

15. The process according to claim 1, further comprising a step of passivating the intermediate particles.

16. The process according to claim 1, further comprising a step of passivating the intermediate particles to remove the reactive Si—H bonds.

17. The process according to claim 1, wherein the step of comminuting the intermediate particles is performed in an inert gas or in an environment where the oxygen concentration is less than 10 vol % oxygen.

18. The process according to claim 1, wherein the micropores and/or mesopores of the porous carbon frameworks have a total pore volume as measured by gas adsorption of $P_1$ $cm^3$/g, wherein the value of $P_1$ is in the range from 0.4 to 2.5.

19. The process according to claim 18, wherein the value of $P_1$ is in the range from 0.65 to 1.2.

20. The process according to claim 1, wherein the porous carbon frameworks have $D_{50}$ particle diameter of at least 30 μm.

21. The process according to claim 1, wherein the porous carbon frameworks have a $D_{50}$ particle diameter of no more than 1000 μm.

22. The process according to claim 1, wherein the porous carbon frameworks have a $D_{10}$ particle diameter of at least 5 μm and a $D_{90}$ particle diameter of no more than 1,500 μm.

23. The process according to claim 1, wherein the porous carbon frameworks have a BET surface area of at least 750 $μm^2$/g and no more than 4,000 $μm^2$/g.

24. The process according to claim 1, wherein the porous carbon frameworks have a $PD_{50}$ pore diameter as measured by gas adsorption of no more than 5 nm.

25. The process according to claim 1, wherein the porous carbon frameworks have a $PD_{50}$ pore diameter as measured by gas adsorption of no more than 2 nm.

26. The process according to claim 1, wherein the porous carbon frameworks have a $PD_{90}$ pore diameter as measured by gas adsorption of no more than 10 nm.

27. The process according to claim 1, wherein the porous carbon frameworks have a volume fraction of micropores as measured by gas adsorption of greater than 0.5.

28. The process according to claim 1, wherein the composite particles have a $D_{50}$ particle diameter in the range from 0.5 to 20 μm.

29. The process according to claim 1, wherein the composite particles have a $D_{50}$ particle diameter in the range from 0.5 to 8 μm.

30. The process according to claim 4, wherein the composite particles have a $D_{10}$ particle diameter of at least 0.2 μm and a $D_{90}$ particle diameter of no more than 80 μm.

31. The process according to claim 1, wherein the composite particles have a particle size distribution span of no more than 5.

32. The process according to claim 1, wherein the electroactive material is silicon, wherein the pore volume of the composite particles is expressed as $P_1$ cm³/g, and wherein the weight ratio, for the composite particles, of silicon to the porous carbon framework in the composite particles is in the range from $[0.5 \times P_1$ to $2.2 \times P_1]:1$.

33. The process according to claim 1, wherein the electroactive material is silicon, and wherein the composite particles comprise 30 to 80 wt % silicon.

34. The process according to claim 1, wherein the composite particles comprise no more than 10 wt % oxygen.

35. A particulate material comprising the coated composite particles obtainable by the process according to claim 1.

* * * * *